United States Patent [19]
Tults

[11] Patent Number: 5,212,554
[45] Date of Patent: May 18, 1993

[54] DIGITAL METHOD AND APPARATUS FOR EVALUATING A FREQUENCY PARAMETER OF AN IF SIGNAL

[75] Inventor: Juri Tults, Indianapolis, Ind.

[73] Assignee: Thomson Consumer Electronics, Inc., Indianapolis, Ind.

[21] Appl. No.: 635,843

[22] Filed: Dec. 31, 1990

[51] Int. Cl.$^5$ .............................................. H04N 5/50
[52] U.S. Cl. ................... 358/195.1; 358/193.1; 455/182.1; 455/192.1
[58] Field of Search ............... 358/195.1, 193.1, 191.1, 358/194.1; 455/164, 173, 182, 192, 257, 258

[56] References Cited

U.S. PATENT DOCUMENTS

| | | | |
|---|---|---|---|
| 4,031,549 | 6/1977 | Rast et al. | 358/193 |
| 4,387,400 | 6/1989 | Borg | 455/182 |
| 4,485,404 | 11/1984 | Tults | 358/195.1 |
| 4,689,685 | 8/1987 | Testin et al. | 358/195.1 |
| 4,727,591 | 2/1988 | Manlove | 455/164 |
| 4,868,892 | 9/1989 | Tults et al. | 455/182 |
| 4,903,328 | 2/1990 | Ichikawa | 455/164 |
| 5,003,397 | 3/1991 | Wink | 358/195.1 |

*Primary Examiner*—Victor R. Kostak
*Assistant Examiner*—Glenton B. Burgess
*Attorney, Agent, or Firm*—Joseph S. Tripoli; Peter M. Emanuel

[57] ABSTRACT

A tuning system of a television receiver includes a digital automatic fine tuning (AFT) unit for generating a digital AFT signal representing the deviation of the frequency of the picture carrier of the IF signal from a nominal frequency. The digital AFT unit includes a counter for counting cycles of picture carrier during repetitive counting intervals which occur during a measurement period having a duration at least as long as the duration of one field of a television signal. The duration and spacing of the counting intervals are selected so that at least one counting interval occurs during the vertical blanking interval in which the picture carrier is not likely to be over-modulated and therefore not likely to result in erroneous low counts. The contents of the counter are evaluated at the end of each counting cycle to determine if a first count corresponding to a nominal frequency or a second count corresponding to the frequency having a positive frequency deviation have been produced. At the end of the measurement interval, the frequency of the picture carrier relative to the nominal frequency is evaluated by determining which one, if any of the first and second counts have been produced. A low frequency is indicated by the absence of both. A frequency within specified limits is indicated by the presence of the first but not the second counts A high frequency is indicated by the presence of both counts. The technique employed does not require that the timing signal be synchronized with the vertical blanking interval for reliable counting.

10 Claims, 6 Drawing Sheets

DIGITAL METHOD AND APPARATUS FOR EVALUATING A FREQUENCY PARAMETER OF AN IF SIGNAL

FIELD OF THE INVENTION

The present invention relates to a digital method and apparatus for measuring the frequency of an intermediate frequency (IF) signal such as is produced in a television receiver.

BACKGROUND OF THE INVENTION

In a television receiver, RF signals provided by an RF source are received by an RF amplifier. The RF amplifier selects the RF signal corresponding to the channel selected by a user. The selected RF signal is coupled to a mixer where it is mixed with a local oscillator (LO) signal having a frequency corresponding to the selected channel to produce an intermediate frequency (IF) signal. The frequency of the LO signal is controlled so that the frequency of the picture carrier of the IF signal is at a nominal value, e.g., 45.75 MHz in the United States.

It is known to control the LO frequency using two tuning arrangements: a first for establishing the frequency of the LO signal at the nominal value for a selected channel; and a second for changing the frequency of the LO signal from the nominal value, e.g., to account for frequency offsets of the RF for the selected channel signal from its standard value. The frequency of the RF signal may be offset from its standard value, defined by broadcast specifications, when the RF signal source is other than a broadcast receiving antenna, such as cable distribution network or video accessory like a video cassette recorder (VCR) or video disk player. The first arrangement may have a closed loop or frequency synthesis configuration, e.g., including a phase locked loop (PLL) or a frequency locked loop (FLL), or an open loop or voltage synthesis configuration, e.g., including a digital-to-analog converter. The second arrangement typically includes an automatic fine tuning (AFT) unit for generating an AFT signal representing the deviation of the frequency of IF picture carrier from its nominal value.

Usually the circuitry for generating an AFT signal is "analog" circuitry and includes a filter, often referred to as the "AFT tank", for generating an analog AFT signal having a level with a polarity and a magnitude which represent the sense and the magnitude of the deviation of the frequency of the IF picture carrier from its nominal value. In some tuning systems such as the one disclosed in U.S. Pat. No. 4,031,549, entitled "Television Tuning System with Provisions for Receiving RF Carrier at Nonstandard Frequency", issued to Rast, Henderson and Wine on Jul. 21, 1977, the analog AFT signal is used to directly control the LO frequency. In other tuning systems, such as disclosed in U.S. Pat. No. 4,868,892, entitled "Tuning System for Calculating the Local Oscillator Frequency from an AFT Characteristic", issued to Tults, Testin and Rumreich on Sep. 19, 1989, the analog AFT signal is converted to a digital signal (usually consisting of two bits) which is used to control a phase locked loop and thereby the LO frequency.

It is desirable to provide a "digital" AFT unit since the AFT tank circuit associated with an "analog" AFT unit requires components which cannot readily be incorporated in an integrated circuit (IC) and which may require alignment. In addition, a digital AFT unit is more compatible with a digital tuning control unit since interface circuitry for converting an analog AFT signal to a digital AFT signal is not required.

U.S. Pat. No. 4,485,404, entitled "Digital AFT which is Activated During the Vertical Retrace Intervals", issued to Tults on Nov. 27, 1984 discloses a tuning system in which a counting arrangement is used to measure the frequency of the IF picture carrier to produce a digital AFT signal. The counting arrangement is enabled to count cycles of the IF picture carrier during a measurement period. Since the IF picture carrier is amplitude modulated and may be over-modulated in response to image information to the point at which counting cycles of the IF picture carrier becomes unreliable, the measurement interval is caused to occur only during the vertical retrace or blanking interval (VBI) in which the picture carrier is not over-modulated. However, that requires reliable detection of the VBI which may not be possible with certain television signals. For example: the television signal may be scrambled; the synchronization signal during the VBI may be a nonstandard type, e.g., to make tape copying more difficult; or the television signal may be weak.

SUMMARY OF THE INVENTION

According to an aspect of the present invention, cycles of the IF picture carrier are counted during repetitive counting intervals of a measurement period having a duration at least as long as the duration of one television field including both picture intervals in which the picture carrier may be over-modulated and blanking intervals in which the picture carrier is not over-modulated. The counting intervals have a duration and are spaced so that at least one counting interval occurs during the vertical blanking interval (VBI) although the counting intervals do not have a predictable phase relationship to the VBI. At the end of the measurement interval, the relationship of the picture carrier frequency to its nominal value is evaluated by determining which, if any, of two predetermined counts have been produced during the entire measurement interval. Preferably, the first count corresponds to a range of frequencies surrounding the nominal frequency value and the second count corresponds to a range of frequencies higher and adjacent to the first range.

BRIEF DESCRIPTION OF THE DRAWINGS

For a better understanding of the present invention, reference should be made to the accompanying Drawings, in which.

In the various Figures, the same or similar elements and signals are identified in the same manner.

DETAILED DESCRIPTION OF THE DRAWINGS

Figure 1:
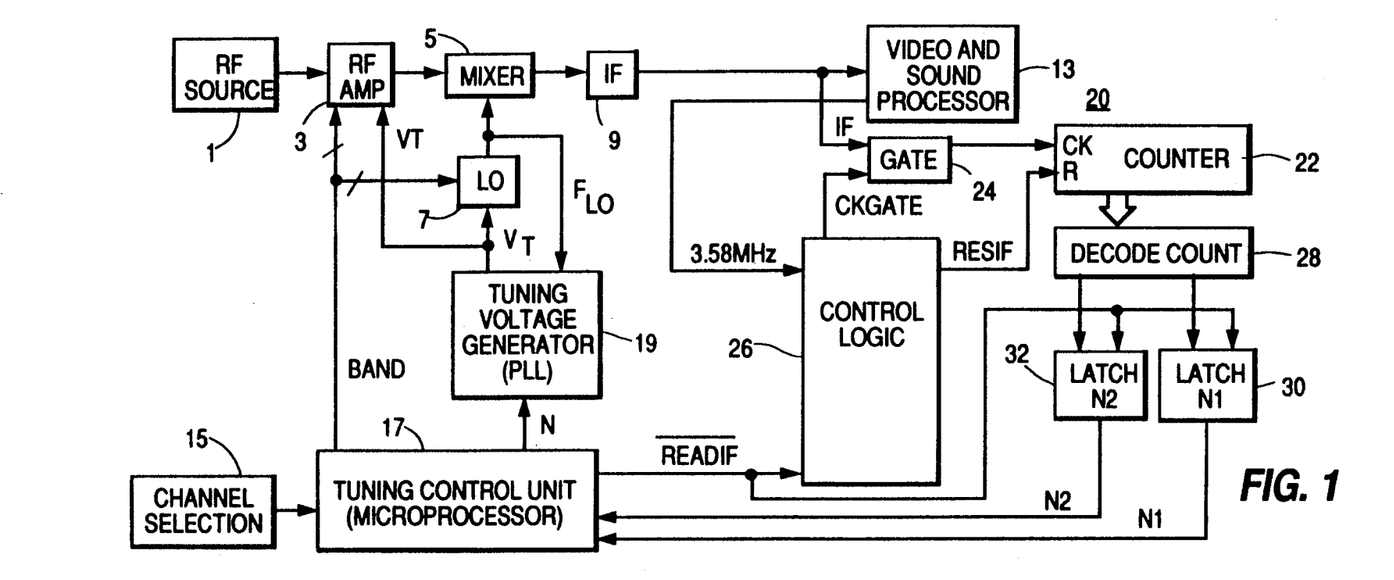
FIG. 1 is a block diagram of a tuning system of a television receiver including a digital AFT unit including a counting arrangement for counting cycles of the IF picture carrier in order to generate a digital AFT signal in accordance with the present invention.

In FIG. 1, a source 1 provides a plurality of RF television signals corresponding to respective channels. An RF television signal includes modulated picture, color and sound carriers. The RF signals supplied by RF source 1 are coupled to an RF amplifier 3 which is turned in response to a tuning voltage ($V_T$) to select one of the RF signals corresponding to a channel selected by a user. The selected RF signal is coupled to a mixer 5. Mixer 5 also receives a local oscillator (LO) signal generated by a LO 7. LO 7 is also responsive to the tuning voltage to control the frequency of the LO signal in accordance with the selected channel. Mixer 5 heterodynes the RF signal selected by RF amplifier 3 with the LO signal generated by LO 7 to produce an IF signal including modulated picture, color and sound carriers corresponding to those of the selected RF signal. In the United States the picture carrier has a nominal frequency of 45.75 MHz, the color carrier has a nominal frequency of 42.17 MHz and the sound carrier has a nominal frequency of 41.25 MHz.

RF amplifier 3 and local oscillator 7 each include tuned circuits for determining their frequency responses. Each tuned circuit includes an inductor and a voltage controlled capacitance diode, commonly referred to as a "varactor" diode. The varactor diode is reverse biased by the tuning voltage to exhibit a capacitive reactance. The magnitude of the tuning voltage determines the magnitude of the capacitive reactance and therefore the frequency response of the tuned circuit. Since a single varactor controlled tuned circuit configuration is not capable of being tuned throughout the entire television range, different tuned circuit configurations are selectively enabled in response to band selection control signals generated in accordance with the frequency bands of the selected channels.

The IF signal generated by mixer 5 is coupled to an IF section 9 which filters and amplifies the received IF signal. The filtered and amplified IF signal is coupled to a video and sound processor 13. Processor 13 demodulates the filtered and amplified IF signal to produce a baseband video signal representing luminance, chrominance and synchronizing information. The video information is organized in sequential fields including line intervals including picture information and horizontal and vertical retrace blanking intervals including synchronization information. Processor 13 also extracts the sound information from the IF signal to produce an audio signal.

The user selects the channel to be received using channel selection unit 15 including a keypad (not shown) mounted on either a remote control transmitter (not shown) or directly on the housing of the television receiver itself. A tuning control unit 17, e.g., comprising a microprocessor operating in accordance with a stored software program, is responsive to command signals produced by channel selection unit 15 to generate the band selection control signals for RF amplifier 3 and LO 7 and a digital signal representing a number N related to the LO frequency for the selected channel. In the exemplary embodiment, the tuning voltage ($V_T$) is generated by a phase locked loop (PLL) 19 which controls the frequency of the LO signal so that it is proportional to a reference frequency signal derived from the output signal of a crystal oscillator (not shown) by the number N in the manner described in greater detail in U.S. Pat. No. 4,868,892 issued to Tults, Testin and Rumreich referred to above. In addition to the channel number of the selected channel, the number N is also controlled in response to an AFT signal representing the deviation of the frequency of the IF picture carrier from its nominal value, e.g., 45.75 MHz in the United States, so as to compensate for any deviation of the frequency of the RF signal for the selected channel from it standard (broadcast) value. The frequency of the RF signal may be offset from its standard value when RF source 1 comprises a cable distribution network or video accessory, such as a VCR or video disk player. The manner in which this frequency correction is accomplished is also described in more detail in the Tults, et al. U.S. patent.

The portion of the tuning system described so far is conventional. The remaining portion of the tuning system concerns a digital AFT unit 20 with which the present invention is primarily concerned.

Digital AFT unit 20 measures the frequency of the IF picture carrier by counting the number of cycles of the IF picture carrier during counting intervals or "windows" having a predetermined duration. The IF picture carrier is amplitude modulated by picture information during line intervals and other, mainly synchronizing, information during horizontal and vertical retrace blanking intervals. The picture carrier may be overmodulated with picture information resulting in unreliable counting of its cycles. Therefore, as earlier noted, it has been proposed that the cycles of the IF picture carrier be counted only during the vertical blanking interval (VBI), where the carrier is not over-modulated. However, it may be difficult to determine when the VBI occurs if the VBI is not of normal form because, e.g., the television signal is scrambled, or modified to hamper tape copying, or weak.

In the present invention, the windows in which counting of the IF picture carrier cycles takes place are distributed throughout a measuring period of at least one field period of the television signal, e.g., 16.7 milliseconds (ms) in the United States. Although there is a random phase relationship between the windows and the VBI, the duration and spacing of the windows is chosen so that at least one window falls within the VBI during each measurement period. The counting intervals or windows are defined by pulses of a stable timing signal. For example, as is indicated in FIG. 1, the timing signal may be derived from the 3.58 MHz color subcarrier oscillator (not shown) included within video and audio processor 13. By choosing windows having a duration of 35.76 microseconds ($\mu$s) and spaced by the same amount, the IF picture carrier is sampled about 230 times per 16.7 ms measuring period. Therefore, it is assured that at least some of the windows are within the VBI where the picture carrier is not over-modulated and therefore can be reliably counted.

The closest frequency to the nominal IF picture carrier frequency of 45.75 MHz which has an integral number of cycles within a 35.76 μs window is 45.751 MHz (i.e., a frequency having a deviation of 1 KHz). Ideally, e.g., for an IF picture carrier frequency of 45.751 MHz and a window of 35.76 μs duration, the count per window should be 1636 cycles. However, the phase relationship of the windows and the IF picture carrier is random, so that the count will vary from window to window. This also applies to other IF picture carrier frequencies. In addition, a particular count can be produced for a range of IF picture carrier frequencies. The probability that a particular count will occur for different IF picture carrier frequencies is indicated by the graph shown in FIG. 2. In the graph, the IF picture carrier frequency is indicated by the deviation (ΔIF) from an IF picture carrier frequency of 45.751 MHz.

Figure 2:
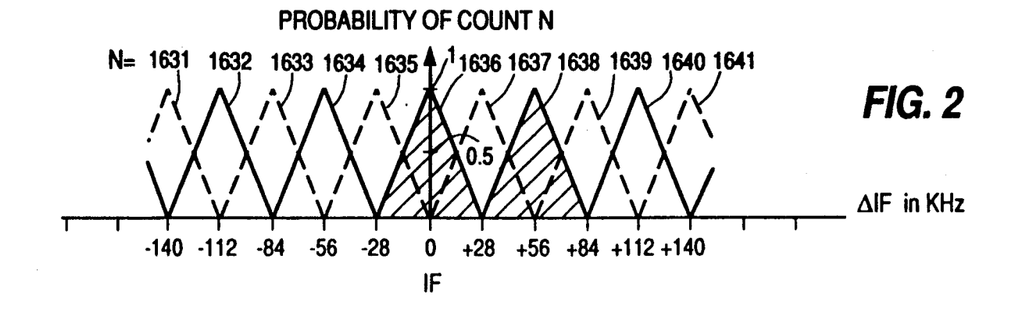
FIG. 2 is a graph illustrating the relationship between probability of the occurrence of various counts (N) of the cycles of the IF picture produced by the counting arrangement of the digital AFT unit shown in FIG. 1 as a function of the deviation of IF picture carrier frequency from a nominal value.

The counts produced in the windows spread over the field period may be affected by over-modulation of the picture carrier or other causes of dropouts resulting in counts which are too low (rather than too high). In addition, noise manifests itself as signal components having frequencies near the center of the IF passband, e.g., at about 43 MHz, and therefore results in low counts. Consequently, low counts are ignored.

By examining the graph shown in FIG. 2, it will be appreciated that by detecting only two count conditions, N1≧1636 associated with a range of frequencies surrounding the nominal picture carrier frequency of 45.751 MHz and N2≧1638 associated with the higher adjacent range of frequencies, it can be determined whether the IF picture carrier frequency is low, high, or within specified limits as indicated in the following table. In the table a "1" indicates the presence of a count and a "0" indicates absence of a count.

TABLE 1

| N1 ≧ 1636 | N2 ≧ 1638 | ΔIF (KHZ) | IF (MHz) |
|---|---|---|---|
| 0 | 0 | < −28 | LOW <45.723 |
| 1 | 0 | −28 < ΔIF < +28 | WITHIN LIMITS 45.723 < IF < 45.779 |
| 1 | 1 | > +28 | HIGH >45.779 |

With these underlying principals in mind, digital AFT 20 shown in FIG. 1 will be described in detail.

Referring again to FIG. 1, an IF signal derived from the final IF amplifier of IF section 9 and suitably limited to form a signal compatible with logic devices is coupled to a gate 24. Gate 24 is selectively caused to couple the IF signal to a counter 22 in response to pulses of a CKGATE signal generated by a control logic unit 26 when enabled by the low level of a $\overline{\text{READIF}}$ signal. The low level of the $\overline{\text{READIF}}$ signal has a duration of 16.7 ms and is generated by tuning control unit 17 when it is desired to measure the IF picture carrier frequency. The CKGATE signal defines the counting intervals or "windows" distributed throughout the 16.7 ms measuring period.

The cycles of the IF signal passed by gate 24 within each window are counted by counter 22. Counter 22 responds to the IF picture carrier and not to the other components of the IF signal because the IF picture carrier is the dominant component of the IF signal. Counter 22 is reset in response to a RESIF signal generated by control logic unit 26 immediately before each window occurs. Selected outputs of the stages of counter 22 which uniquely indicate the presence of the counts N1 and N2 are coupled to a count decoding logic unit 28 which produces single bits indicating the presence ("1") or absence ("0") of the respective counts N1 and N2. The bits indicating the counts N1 and N2 are stored in latches 30 and 32, respectively. Latches 30 and 32 are held reset before the beginning of the 16.7 ms measuring period in response to the high level of the $\overline{\text{READIF}}$ signal, but are not reset again during the measurement period.

The contents of latches 30 and 32 are read at the end of the 16.7 ms measuring period and interpreted according to Table 1 by tuner control unit 17 in order to determine whether the IF picture carrier frequency is low, high or within specified limits. Based on the determination, tuning control unit 17 controls the number N associated with PLL 19 and thereby the LO frequency in the manner disclosed in U.S. Pat. No. 4,485,404 referred to above. Provided the LO frequency is adjusted in steps of less than 56 KHz (the frequency range covered by one probability peak indicated in FIG. 2) a substantially correct and stable tuning condition is achievable. For example, the LO frequency may be adjusted in steps of 31.25 KHz.

Figure 3:
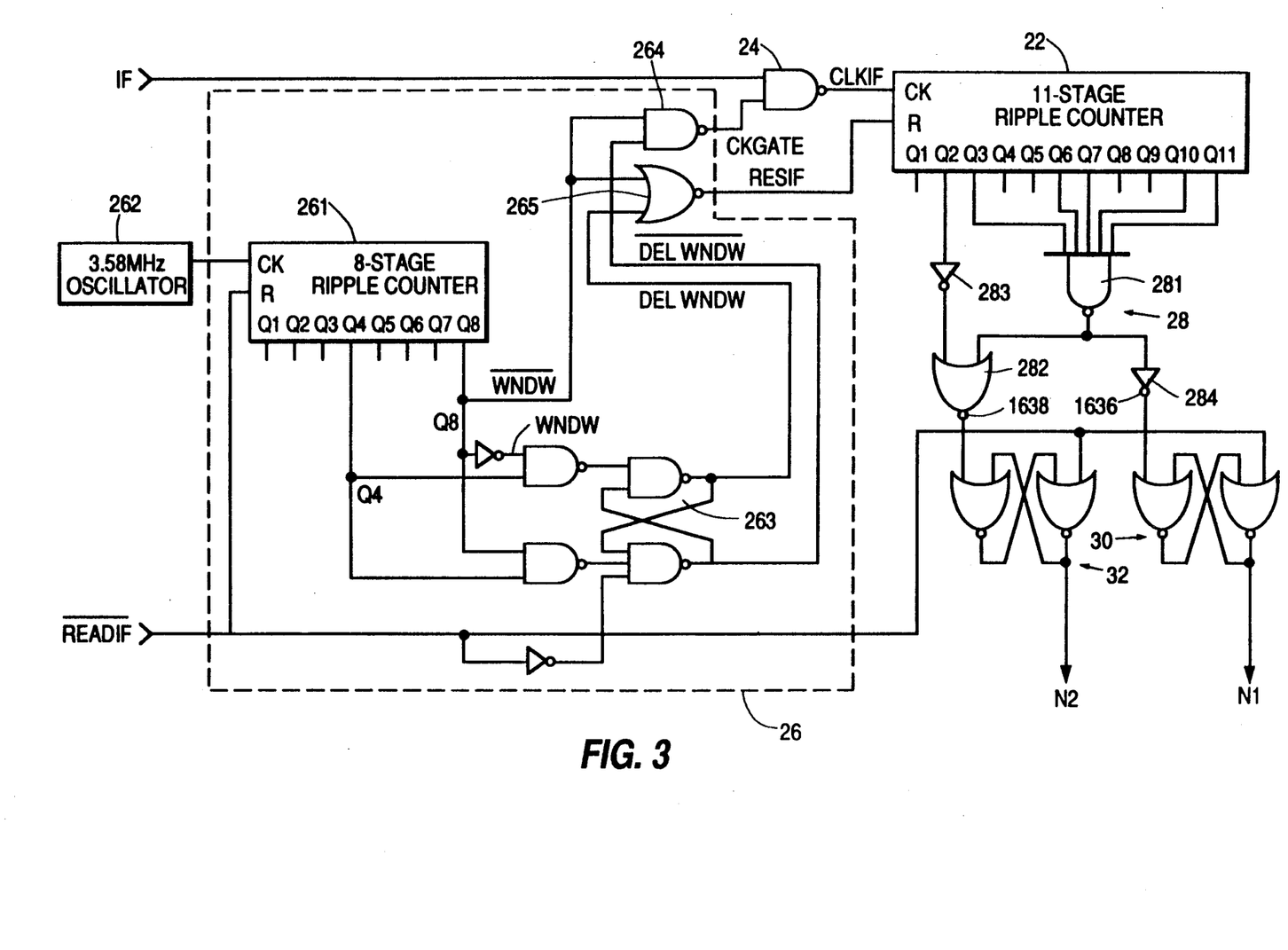
FIG. 3 is a logic diagram of an implementation of the digital AFT unit shown in FIG. 1.
Figure 4:
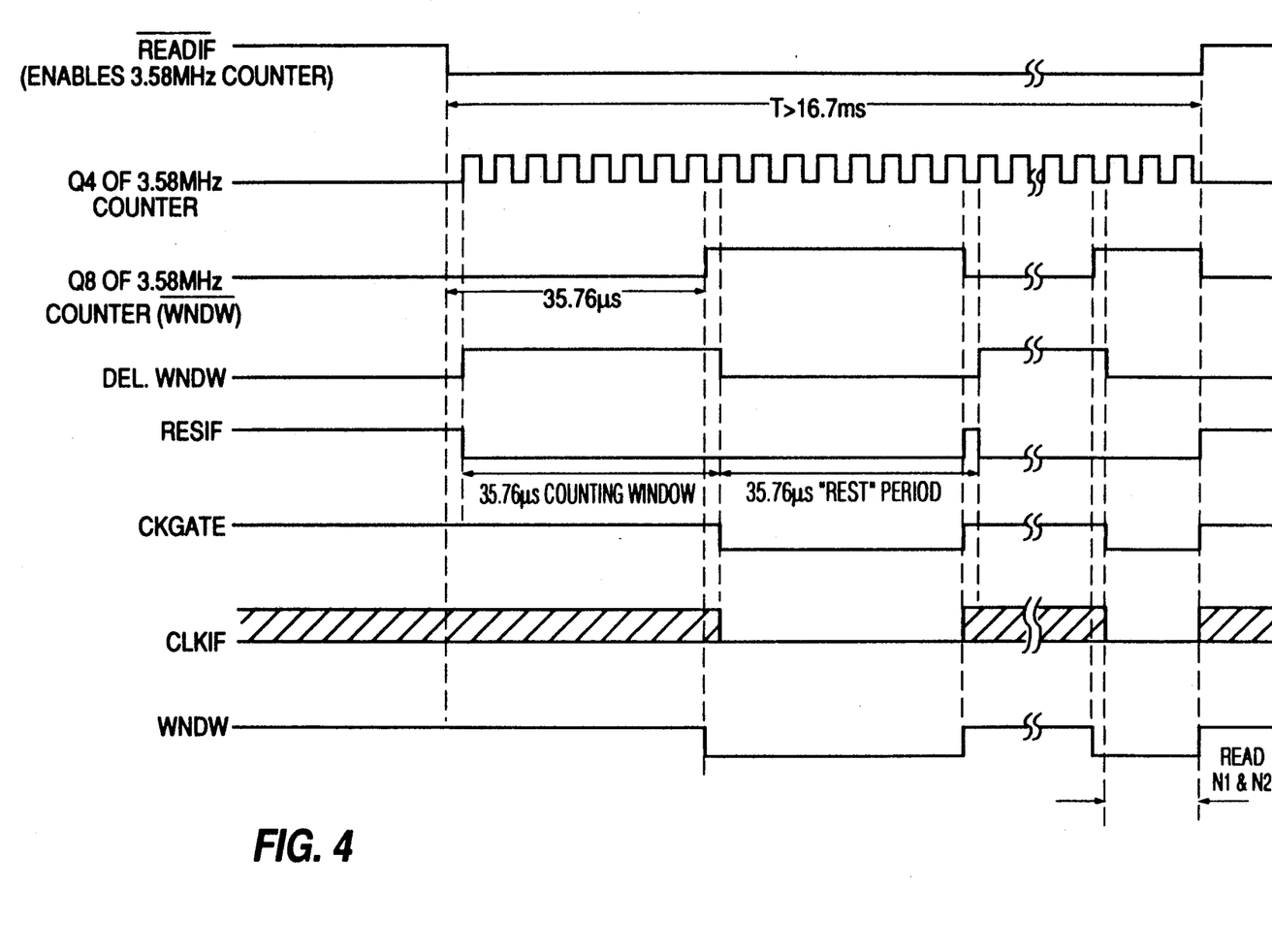
FIG. 4 contains waveforms of signals generated during the operation of the implementation shown in FIG. 3.

An implementation of digital AFT unit 20 is shown in FIG. 3. Waveforms of various signals developed in connection with the operation of the implementation of digital AFT unit 20 shown in FIG. 3 are illustrated in FIG. 4.

As shown in FIG. 3, the IF is applied to a NAND gate comprising gate 24 shown in FIG. 1. NAND gate 24 also receives gating pulses defining the window periods contained with a signal designated CKGATE in FIG. 3. The gated IF signal, indicated by the cross-hatched waveform CLKIF, is supplied to the clock input (CK) of 11-stage ripple counter 22. Counter 22 is reset before the beginning of each counting interval and is thereafter enabled to count in response to the signal RSIF.

Count decoding unit 28 comprises a NAND gate 281 having inputs which are coupled to the ones of the outputs (Q3,6,7,10 and 11) of the counter 22 appropriate for detecting the occurrence of a count of 1636 (N1). Decoding unit 28 also comprises a NOR gate 282 having inputs coupled to the Q2 output of counter 22 via an inverter 283 and to the output of NAND gate 281 for detecting the occurrence of a count of 1638 (N2).

The "set" input of latch 30 (comprising two NOR gates in a cross-coupled configuration to form a flip-flop or bistable multivibrator) is coupled to the output of NAND gate 281 via an inverter 284. The set input of latch 32 (also comprising two cross-coupled NOR gates) is coupled to the output of NOR gate 282. Latches 30 and 32 are held reset to logic "0" by the $\overline{\text{READIF}}$ signal when this signal is high. The outputs of latches 30 and 32 are set to logical '1's upon the occurrence of the counts N1 and N2, respectively. The outputs of latches 30 and 32 are coupled to tuning control unit 17.

Control logic unit 26 comprises an 8 stage ripple counter 261 which counts the cycles of a 3.58 MHz crystal oscillator 262 to produce various control signals shown in FIG. 4. As indicated in FIG. 1, crystal oscillator 262 may comprise the color subcarrier oscillator (not shown) of the receiver contained in video and sound processing unit 13. The control signals are produced when counter 261 is enabled in response to the low level of the $\overline{\text{READIF}}$ signal applied to its reset (R).

The $\overline{\text{READIF}}$ signal also enables a latch 263 comprising four NAND gates, and an inverter. Latch 263 receives the Q8 output (also identified as $\overline{\text{WNDW}}$) and the Q4 output of counter 261. As shown in FIG. 4, the state of the outputs of latch 263 (DELWNDW and $\overline{\text{DELWNDW}}$) change after the state of $\overline{\text{WNDW}}$ (Q8) changes in response to the next leading edge of the Q4 pulse (provided $\overline{\text{READIF}}$ is low). The CKGATE signal for allowing the IF signal to reach the clock (CK) input of counter 22 is produced by a NAND gate 264 in response to the $\overline{\text{WNDW}}$ (Q8) and $\overline{\text{DELWNDW}}$ signals. The RESIF signal for resetting counter 22 at the beginning of each counting window is produced by a NOR gate 265 in response to the DELWNDW and $\overline{\text{WNDW}}$ signals.

Tuning control unit 17 shown in FIG. 1 reads the contents of latches 30 and 32 just before the positive transition of $\overline{\text{READIF}}$ signal after the 35.76 μs wide counting windows separated by 35.8 μs have been generated for a time period of at least 16.7 ms as indicated in FIG. 4. After reading N1 and N2, tuning control unit 17 will act as follows:

1. If N1=1 and N2=1, then the IF frequency is too high and the LO frequency is decreased, e.g. by 31.25 KHz.
2. If N1=1 and N2=0, then the IF frequency is within specified limits and the LO frequency is left unchanged.
3. IF N1=0 and N2=0, then the IF frequency is too low and the LO frequency is increased, e.g., by 31.25 KHz.

Figure 5:
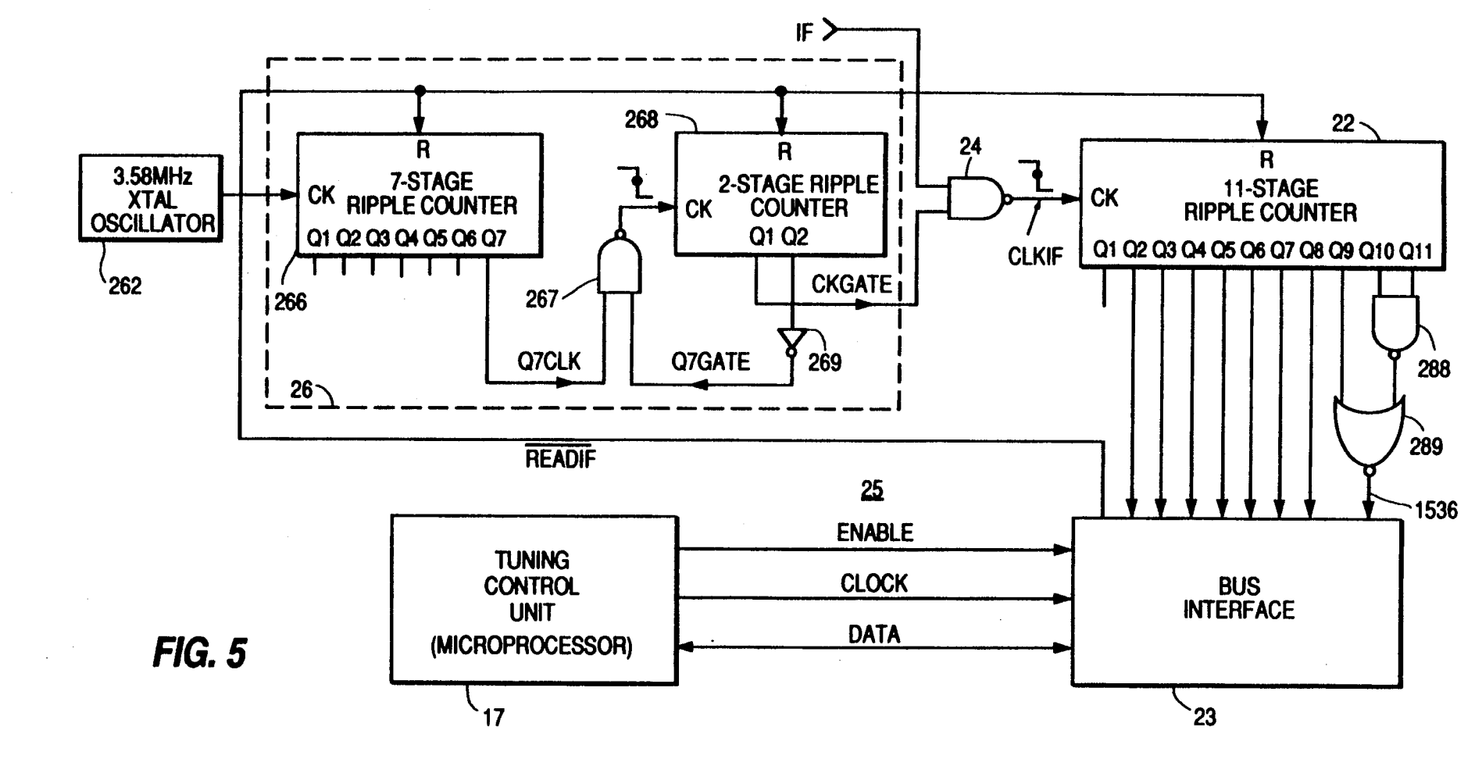
FIG. 5 is a logic diagram of another embodiment of the digital AFT unit shown in FIG. 1.
Figure 6:
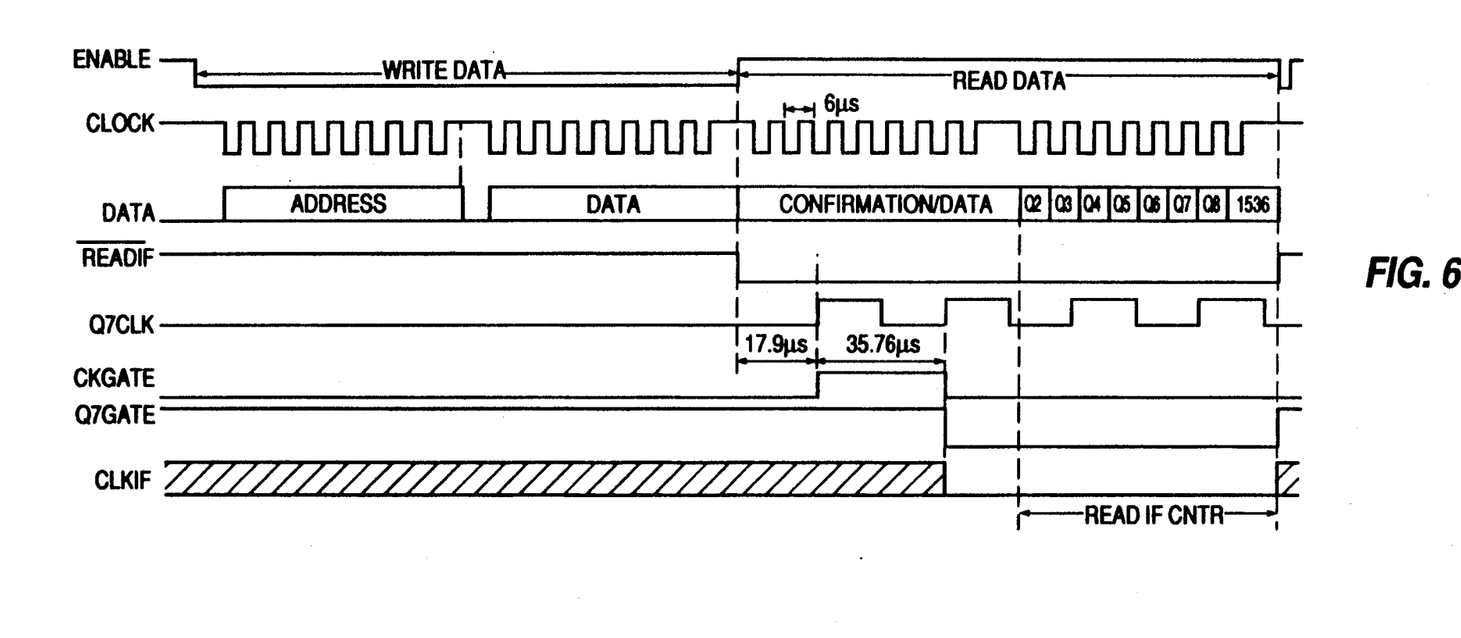
FIG. 6 contains waveforms of signals generated during the operation of the implementation shown in FIG. 5.

Another implementation of a digital AFT unit is shown in FIG. 5. Waveforms for various signals developed in connection with the implementation shown in FIG. 5 are shown in FIG. 6.

The major difference between the digital AFT unit shown in block diagram in FIG. 1 and in more detail logic diagram form in FIG. 3 and the AFT unit shown in FIG. 5 is that the functions performed by count decoder 28 and latches 30 and 32 of the digital AFT unit shown in FIGS. 1 and 3 are performed by tuning control unit 17 under software program control in the digital AFT unit shown in FIG. 5. To accomplish this, the contents of counter 22 are coupled to bus interface unit 23, including a parallel-to-serial converter, which converts the bits representing the count to a serial bit stream which is coupled to tuning control unit 17 via a serial data bus 25. The contents of counter 22 are partially decoded by a logic arrangement including NAND gate 288 and NOR gate 289 to produce a signal indicative of a count of 1536 so that only the Q2–Q8 outputs of counter 22 and the 1536 count indication, consisting of a total of 8 bits compared to the 12 output bits of counter 22, need to be coupled to tuning control unit 17. By way of example, serial data bus 25 may be of the type employed in television receivers manufactured by Thomson Consumer Electronics of France and illustrated in FIGS. 5 and 6. Serial data bus 25 may also be of the well known IM (INTERMETALL) type developed by ITT INTERMETALL Semiconductors of Germany described in the ITT publication "Digit 2000 VLSI Digital TV System" or of the also well known I²C (Inter IC) type developed by Philips of The Netherlands and described in Philips Technical Publication 110—"I²C Bus In Consumer Electronics".

Briefly, as is indicated in FIG. 5, serial bus 25 includes three conductors: one for a DATA signal; one for a CLOCK signal; and one for an ENABLE signal. The waveforms for these three signals are illustrated in FIG. 6. Data bus 25 is "bidirectional", i.e., data can be coupled in both directions between a "master" unit, usually including a microprocessor such as tuning control unit 17, and a "slave" unit including a bus interface unit such as bus interface unit 23. The data is synchronously transmitted with respect to clock pulses of the CLOCK signal. The CLOCK signal is generated by tuning control unit 17 and is used by bus interface unit 23 to decode the DATA signal. The ENABLE signal is also generated by tuning control unit 17 and initiates the communication process between tuning control unit 17 and bus interface unit 23.

A first, i.e., low level, portion of the ENABLE signal is used to transmit or "write" data from the master unit to the slave unit. During a first interval of the "write" portion, an "address" word, e.g., of 8 bits, indicating the function to be controlled is transmitted. During a second interval of the "write" portion, a data word, e.g., of 8 bits, representing a particular aspect of the function to be controlled may be transmitted. In the digital AFT unit shown in FIG. 5, the "address" word is used to transmit a READIF command for causing bus interface unit 23 to generate the low level of the $\overline{\text{READIF}}$ signal as indicated in FIG. 6. A second, i.e., high level, portion of the ENABLE signal is used to transmit or "read" data from the slave unit to the master unit. Two data words, e.g., of 8 bits each, may be transmitted during the "read" portion of the ENABLE signal. The first data word must include a confirmation of the receipt of the "address" word transmitted from the master unit and may comprise a portion of the "address" word. In the digital AFT unit shown in FIG. 5, the second data word is used to transmit the data representing the count of counter 22 (i.e., Q2–Q8 and the "1536" count indication bit) to tuning control unit 17.

Figure 7:
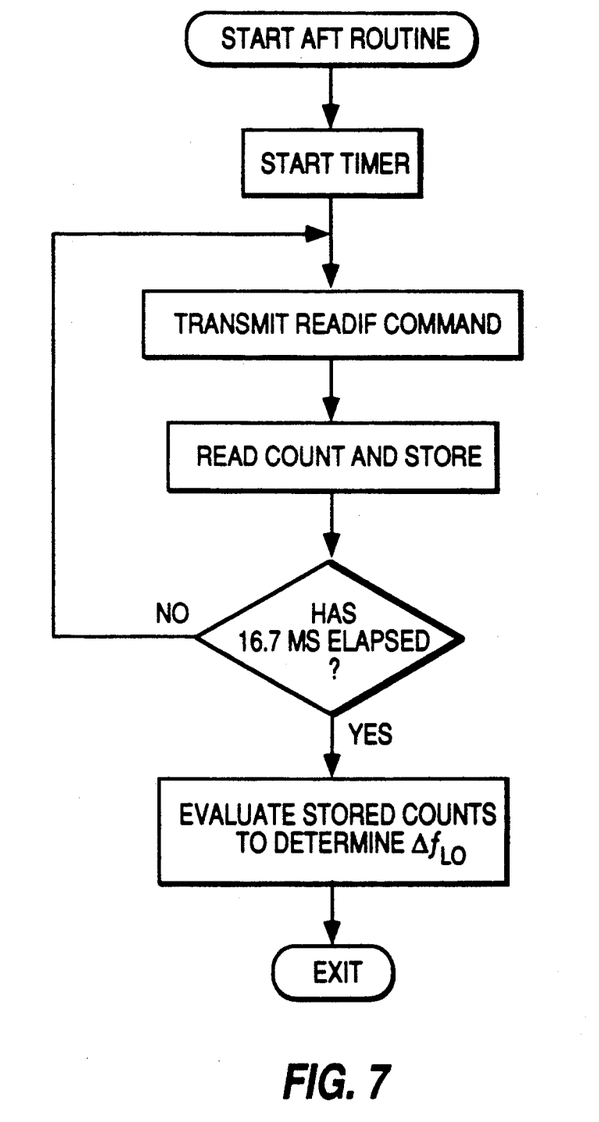
FIG. 7 contains a flow chart of a software program utilized in connection with the implementation shown in FIG. 5.

The flowchart for the portion for the program associated with the digital AFT unit shown in FIG. 5 is shown in FIG. 7. As indicated in FIG. 7, after the AFT subroutine is initiated, a "timer" for measuring elapsed time is started and the READIF command is caused to be transmitted. The resulting low level of the $\overline{\text{READIF}}$ signal enables control logic unit 26 to generate the CKGATE signal which establishes a 35.76 μs counting window. In the implementation shown in FIG. 5, control logic unit 26 includes a 7-stage ripple counter 266, a NAND gate 267, a 2-stage ripple counter 268 and an inverter 269. The waveforms for a Q7 CLK signal and a Q7 GATE signal generated within control logic unit 26 are shown in FIG. 6. The high level of the CKGATE enables a NAND gate, serving as gate 24, to couple the IF signal to counter 22 as is indicated by the cross-hatched portion of the signal CLKIF.

After the termination of the 35.76 μs counting window, i.e., when the CKGATE signal returns to the low level, tuning control unit 17, under software control, examines contents of counter 22 to determine whether the count represented by the 11 bits is equal to or larger than 1636 or 1638 and memorizes the result. The examination can take place any time after 53.66 μs (17.9 μs+35.76 μs) has elapsed after the negative transition of the READIF signal as indicated in FIG. 6. This time is "known" by tuning control unit 17 since clock pulses of the CLOCK signal, which synchronize the communication between tuning control unit 17 and the digital AFT unit are generate by tuning control unit 17 and are therefore related to its instruction cycles. As indicated in FIG. 7, this sequence is repeated over a time period of at least 16.7 ms. Since the communication between tuning control unit 17 and bus interface unit 23 requires slightly more 256 μs (i.e., 4 words×8 bits/word×8 μs/bit) and the VBI includes at least 9 lines having a total duration of 571.5 μs (9 lines×63.5 μs), it is possible to ensure that at least one counting interval occurs during the VBI if the process is repeated, e.g., every 500 μs.

At the end of 16.7 ms measurement period, if one or more of the count samples obtained during the 16.7 ms measurement period was 1638 or greater, then the LO frequency is decreased by decreasing N. If none of the count samples was equal to or greater than 1636 then the LO frequency is increased. If one or more of the count samples was equal to or greater than 1636 but none was equal or greater than 1638, the LO frequency is left unchanged.

It is noted, for comparison, that in the implementation shown in FIG. 5, the low level of the $\overline{\text{READIF}}$ determines the duration of one measurement interval within the 16.7 ms measurement period. However, in the implementation shown in FIG. 3, the low level of the $\overline{\text{READIF}}$ signal corresponds to the entire 16.7 ms measurement period.

Compared to the implementation shown in FIG. 3, the logic circuitry of the implementation shown in FIG. 5 is less complex. However, this is achieved at the expense of a somewhat more complicated software program required for evaluating the counts.

Preferably, the digital AFT unit shown in FIG. 5 is incorporated in an integrated circuit with other portions of the television receiver such as IF section 9 and sections of video and sound processing unit 13. In that case, data bus 25 advantageously both serves to control the various functions of the integrated circuit as well as to control the digital AFT unit and to receive IF picture carrier frequency deviation information from it.

It will be understood that the present invention has been described with reference to a preferred embodiment by way of example and that modifications will occur to those skilled in the art.

For example, although a phase locked loop (PLL) is employed in the embodiment shown in FIG. 1 to generate the tuning voltage a frequency locked loop (FLL), such as disclosed in U.S. Pat. No. 4,485,404 issued to Tults referred to above, may also be employed. For that matter, an opened loop voltage synthesis arrangement utilizing a digital-to-analog converter for converting a digital word to a DC level may be employed.

In addition, the frequency of the IF signal may be divided by a frequency divider (known as a "prescaler") before being coupled to the digital AFT unit.

Further, while the IF signal coupled to digital AFT unit 20 was said to be derived from the final IF amplifier of IF section 9, it may be derived in other ways. For example, the IF signal may be derived from the tuned circuit (not shown) of the synchronous video detector (not shown) included with video and audio signal processing section 13. Advantageously, the pulse signal produced at this point due to the limiting devices (e.g., diodes) may be compatible with the logic devices of the digital AFT unit 20.

Still further, while it was indicated with reference to the software program depicted in FIG. 7 that the actual count after each counting cycle is stored, it is also possible to store only indications that the counts N1 and N2 were produced. In that case, after the 16.7 ms measurement period has elapsed, it is only necessary to determine which ones, if any, of the N1 and N2 count indications have been stored. Furthermore, with respect to the software program indicated in FIG. 7, it is possible to terminate the routine once both of the counts N1 and N2 have been produced and immediately proceed to the desired LO frequency adjustment.

Even further, portions of the digital AFT unit, such as counter 22, may be de-energized at times other than during the measurement period in order to save energy. In that case, a delay should be provided between the beginning of the measurement period (corresponding to the negative transition of the $\overline{\text{READIF}}$ signal) and the beginning of the counting interval (corresponding to the positive transition of the CKGATE signal) to allow sufficient time for the de-energized portions of the digital AFT unit to be energized. The 17.9 μs delay of the CKGATE signal illustrated in FIG. 6 has that purpose.

These and other modifications are intended to be within the scope of the invention defined by the following claims.

I claim:

1. In a television receiver including a tuner for tuning an RF television signal having a picture carrier modulated with video information organized in repetitive fields including line intervals including image information and horizontal and vertical blanking intervals including synchronization information to produce an IF signal having a picture carrier corresponding to the picture carrier of the RF signal, wherein the tuner comprises:
   means for counting cycles of the picture carrier of the IF signal during repetitive counting intervals which occur during a measurement interval having a duration at least as long as the duration of one field;
   means for generating a timing signal which defines the counting cycles as to duration and spacing so that at least one counting interval occurs within the vertical blanking interval; and
   means for determining which one, if any, of first and second predetermined counts have been produced during the measurement interval to evaluate the deviation of the frequency of the IF picture carrier from a nominal frequency.

2. The apparatus defined in claim 1, wherein:
   the first predetermined count corresponds to a first range of frequencies surrounding the nominal frequency of the IF picture carrier and the second predetermined count corresponds to a second range of frequencies which are higher than and adjacent to the first range of frequencies.

3. The apparatus defined in claim 1, wherein:
   said means for determining which one, if any, of the first and second predetermined counts has been produced includes means operating under software program control for comparing counts produced during respective counting intervals with the first and second predetermined counts.

4. The apparatus defined in claim 3, wherein: said means operating under software program control
   a) after each counting interval, determines the count produced during the counting interval;
   b) after each counting interval, stores the count produced during the counting interval; and
   c) at the end of the measuring interval, evaluates the stored counts.

5. The apparatus defined in claim 3, wherein: said means operating under software program a) after each counting interval, determines the count produced during the counting interval;

b) after each counting interval, stores a first predetermined count indication if the first count has been produced during the counting interval and stores a second count indication if the second predetermined count has been produced during the counting interval; and c) after the measuring interval, evaluates the stored count indications.

6. The apparatus defined in claim 3, wherein:

said means for determining which one, if any, of the first and second predetermined counts has been produced includes first and second registers for storing respective first and second indications if said first and second counts, respectively, are produced.

7. A method of evaluating, with respect to a nominal frequency, the frequency of a picture carrier modulated with video information organized in respective fields including line intervals including image information and horizontal and vertical blanking intervals including synchronization information comprising the steps of:

counting cycles of the picture carrier during repetitive counting intervals which are asynchronous with respect to the vertical blanking intervals and which have a duration and are spaced during a measurement period which has a duration at least as long as one field so that at least one counting cycle occurs within one of the vertical blanking intervals; and determining, after the measurement period, which one, if any, of first and second predetermined counts have been produced during respective counting intervals.

8. The method defined in claim 7, wherein:

the first predetermined count corresponds to a first range of frequencies surrounding the nominal frequency of the picture carrier and the second predetermined count corresponds to a second range of frequencies which are higher and adjacent to the first range of frequencies.

9. The method defined in claim 7, wherein: the determining step includes the steps of a) after each counting interval, determining the count produced during the counting interval;

b) after each counting interval, storing the count produced during the counting interval; and c) after the measuring period, evaluating the stored counts.

10. The method defined in claim 7, wherein: the determining step includes the steps of:

a) after each counting interval, determining the count produced during the counting interval;

b) after each counting interval, storing a first predetermined count has indication if the first count has been produced during the counting interval and storing a second predetermined count has indication if the second count has been produced during the counting interval; and c) after the measuring period, evaluating the stored count indications.

* * * * *